United States Patent
Ecton et al.

(10) Patent No.: US 10,438,812 B2
(45) Date of Patent: Oct. 8, 2019

(54) ANISOTROPIC ETCHING SYSTEMS AND METHODS USING A PHOTOCHEMICALLY ENHANCED ETCHANT

(71) Applicant: INTEL CORPORATION, Santa Clara, CA (US)

(72) Inventors: Jeremy D. Ecton, Gilbert, AZ (US); Changhua Liu, Chandler, AZ (US); Arnab Roy, Chandler, AZ (US); Oscar U. Ojeda, Chandler, AZ (US); Timothy A. White, Chandler, AZ (US); Nicholas S. Haehn, Scottsdale, AZ (US)

(73) Assignee: Intel Corporation, Santa Clara, CA (US)

( * ) Notice: Subject to any disclaimer, the term of this patent is extended or adjusted under 35 U.S.C. 154(b) by 97 days.

(21) Appl. No.: 15/474,302

(22) Filed: Mar. 30, 2017

(65) Prior Publication Data
US 2018/0286700 A1 Oct. 4, 2018

(51) Int. Cl.
*H01L 21/3213* (2006.01)
*H05K 3/06* (2006.01)
*H01L 21/67* (2006.01)

(52) U.S. Cl.
CPC .. *H01L 21/32134* (2013.01); *H01L 21/32139* (2013.01); *H05K 3/067* (2013.01); *H01L 21/6708* (2013.01)

(58) Field of Classification Search
CPC ............ C12Q 1/6883; C12Q 2600/136; C12Q 2600/158; C12Q 2600/142; H01L 21/32134; H01L 21/32139; H01L 21/6708; H01L 21/67115; B67D 1/0004; B67D 1/0412; B67D 1/0418; B67D 1/0809; B67D 2001/0092
USPC ........... 216/73, 78, 105; 156/345.11, 345.17, 156/345.37, 345.52
See application file for complete search history.

(56) References Cited

U.S. PATENT DOCUMENTS

| | | | | |
|---|---|---|---|---|
| 9,167,694 | B2* | 10/2015 | Sundaram | ......... H01L 23/49827 |
| 2004/0069636 | A1* | 4/2004 | Meyer | ..................... G03F 7/202 |
| | | | | 204/471 |
| 2011/0031107 | A1* | 2/2011 | Noda | .................. C23C 14/0057 |
| | | | | 204/192.3 |
| 2014/0262755 | A1* | 9/2014 | Deshmukh | ........ H01J 37/32431 |
| | | | | 204/192.35 |

* cited by examiner

*Primary Examiner* — Lan Vinh
(74) *Attorney, Agent, or Firm* — Grossman, Tucker, Perreault & Pfleger, PLLC (57) ABSTRACT

The systems and methods described herein use at least one etchant and at least one photochemically active material in conjunction with electromagnetic energy applied simultaneous with the etchant and photochemically active material during the etching process. The interaction between the electromagnetic energy and the photochemically active material preferentially increases the etch rate in a direction along the axis of incidence of the electromagnetic energy, thereby permitting the anisotropic formation of voids within the semiconductor substrate. These anisotropic voids may be more closely spaced (i.e., arranged on a tighter pitch) than the isotropic voids produced using conventional etching technologies. By placing the voids in the semiconductor substrate on a tighter pitch, greater component density may be achieved.

13 Claims, 6 Drawing Sheets

FIG. 3B (TIME = $t_2$)

FIG. 3D (TIME = $t_4$)

FIG. 3A (TIME = $t_1$)

FIG. 3C (TIME = $t_3$)

FIG. 5

FIG. 6

ANISOTROPIC ETCHING SYSTEMS AND METHODS USING A PHOTOCHEMICALLY ENHANCED ETCHANT

TECHNICAL FIELD

The present disclosure relates to technologies for selective etching of semiconductor substrates.

BACKGROUND

The core patterning step in the semiconductor substrate manufacturing process uses a wet etch process to remove metal from a masked substrate. The wet etch process begins with a layer of copper disposed on a typically non-conductive core material. A dry film resist layer is deposited on the copper layer. The desired pattern is masked on the dry film resist layer prior to curing the dry film resist layer. The dry film resist is developed to remove those portions of the dry film resist that were NOT masked prior to curing, exposing the copper layer in the areas where the dry film resist was removed. An etchant solution, applied under pressure selectively removes the exposed portions of the copper layer. The extent to which the copper layer is removed depends on a variety of factors including the etchant used, the pressure at which the etchant is applied, and the duration the etchant is applied, among others. After etching, the cured dry film resist is removed, exposing the underlying copper layer. Using traditional etching techniques, the removal of copper is essentially isotropic (i.e., equal in all directions radiating outward from the surface of the exposed copper layer). The isotropic nature of the etching process limits substrate component density achievable using current photolithographic techniques.

BRIEF DESCRIPTION OF THE DRAWINGS

Features and advantages of various embodiments of the claimed subject matter will become apparent as the following Detailed Description proceeds, and upon reference to the Drawings, wherein like numerals designate like parts, and in which:

Although the following Detailed Description will proceed with reference being made to illustrative embodiments, many alternatives, modifications and variations thereof will be apparent to those skilled in the art.

DETAILED DESCRIPTION

The systems, methods, and apparatuses disclosed herein employ etching systems and methods using an etchant solution enhanced through the addition of one or more photochemically active or photochemically sensitive etching materials. By combining the photochemically sensitive etching material with exposure to electromagnetic radiation at an appropriate wavelength or an appropriate band of wavelengths, anisotropic etching becomes possible. Anisotropic etching may preferentially or selectively increase the rate of metal removal along the direction of incidence of the electromagnetic energy on the copper surface. For example, exposing the underlying masked metal layer to electromagnetic energy provided at a 90° angle to the surface of the metal layer may increase the removal rate of metal along a vertical axis (i.e., parallel to the incident electromagnetic energy) while reducing the removal rate of metal along a horizontal axis (i.e., perpendicular to the incident electromagnetic energy). Such a preferential removal of metal from the metal layer provides a void in the metal layer having a reduced planar cross-section. By reducing the planar cross section of the voids in the metal layer, component density may be beneficially increased, permitting a greater number of semiconductor components in across a fixed size semiconductor die.

Some degree of anisotropy may be achieved using conventional techniques by creating hydrodynamic conditions that promote non-uniform mixing along the surface of the metal layer, thereby permitting, to a degree, anisotropic etching. Such may be accomplished through judicious control of convective transport and mass diffusion processes by tuning the dry film resist bias, process dwell time, etchant spray characteristics, and bath conditions—all of which, when controlled within defined limits may provide a limited anisotropic etching capability. The control of a large number of process variables to accomplish limited anisotropic etching capabilities is of limited value due to the large volume of rework material generated by the inconsistent and difficult to control process.

The systems and methods described herein beneficially and advantageously improve etch resolution by enhancing anisotropic etching (e.g., preferential downward etching) through by incorporating photochemically active materials to the etchant. The use of photochemically active materials accelerates the etch process when exposed to electromagnetic energy at a particular wavelength or wavelength band. The effectiveness of the photochemically active material may be increased through the use of a dry film resist having a high absorption or reflectivity of electromagnetic energy at the wavelengths used to enhance the etch process. The use of a dry film resist having a high electromagnetic absorption or reflectivity at the wavelengths used to enhance the etch process may promote suppressed sidewall etching or undercutting, thereby further enhancing etch resolution capabilities.

An anisotropic metal etching method to preferentially remove metal along a defined axis is provided. The method may include patterning a mask on a surface of a metal layer; and anisotropically etching exposed portions of the surface of the metal layer by: applying an etchant to the exposed portions of the surface of the metal layer, the etchant including at least one photochemically active material to selectively enhance a removal of metal from the exposed portions of the surface of the metal layer along an axis of incidence of electromagnetic energy in a first spectral band; and exposing the exposed portions of the surface of the metal layer to electromagnetic energy in the first spectral band contemporaneous with applying the etchant to form a plurality of voids in the exposed portions of the surface of the metal layer.

An anisotropic etching system to preferentially remove material along a defined axis is provided. The system may include an etchant applicator to apply an etchant that includes at least one photochemically active material to a mask disposed on a surface of a metal layer and to an exposed portion of the surface of the metal layer; and an illuminator to expose at least the exposed portion of the surface of the metal layer to electromagnetic energy in a first spectral band contemporaneous with application of the etchant by the etchant applicator, the electromagnetic energy in the first spectral band to selectively enhance a removal of metal from the surface of the metal layer along an axis of incidence of electromagnetic energy to form a plurality of voids in the metal layer.

An anisotropic etching system to preferentially remove metal along a defined axis is provided. The system may include: a means for patterning a mask on a surface of a metal layer; and a means for applying an etchant to the exposed portions of the surface of the metal layer, the etchant including at least one photochemically active material to selectively enhance a removal of metal from the exposed portions of the surface of the metal layer along an axis of incidence of electromagnetic energy in a first spectral band; and a means for exposing the exposed portions of the surface of the metal layer to electromagnetic energy in the first spectral band contemporaneous with applying the etchant to form a plurality of voids in the exposed portions of the surface of the metal layer.

An etchant solution is provided. The etchant solution may include: at least one etchant to selectively remove metal from an exposed surface of a metal layer; and at least one photochemically active material to selectively remove the metal from the exposed surface of the metal layer along an axis of incidence of electromagnetic energy in a first spectral band.

As used herein the terms "top," "bottom," "lowermost," and "uppermost" when used in relationship to one or more elements are intended to convey a relative rather than absolute physical configuration. Thus, an element described as an "uppermost element" or a "top element" in a device may instead form the "lowermost element" or "bottom element" in the device when the device is inverted. Similarly, an element described as the "lowermost element" or "bottom element" in the device may instead form the "uppermost element" or "top element" in the device when the device is inverted.

As used herein, the term "logically associated" when used in reference to a number of objects, systems, or elements, is intended to convey the existence of a relationship between the objects, systems, or elements such that access to one object, system, or element exposes the remaining objects, systems, or elements having a "logical association" with or to the accessed object, system, or element. An example "logical association" exists between relational databases where access to an element in a first database may provide information and/or data from one or more elements in a number of additional databases, each having an identified relationship to the accessed element. In another example, if "A" is logically associated with "B," accessing "A" will expose or otherwise draw information and/or data from "B," and vice-versa.

Figure 1A:
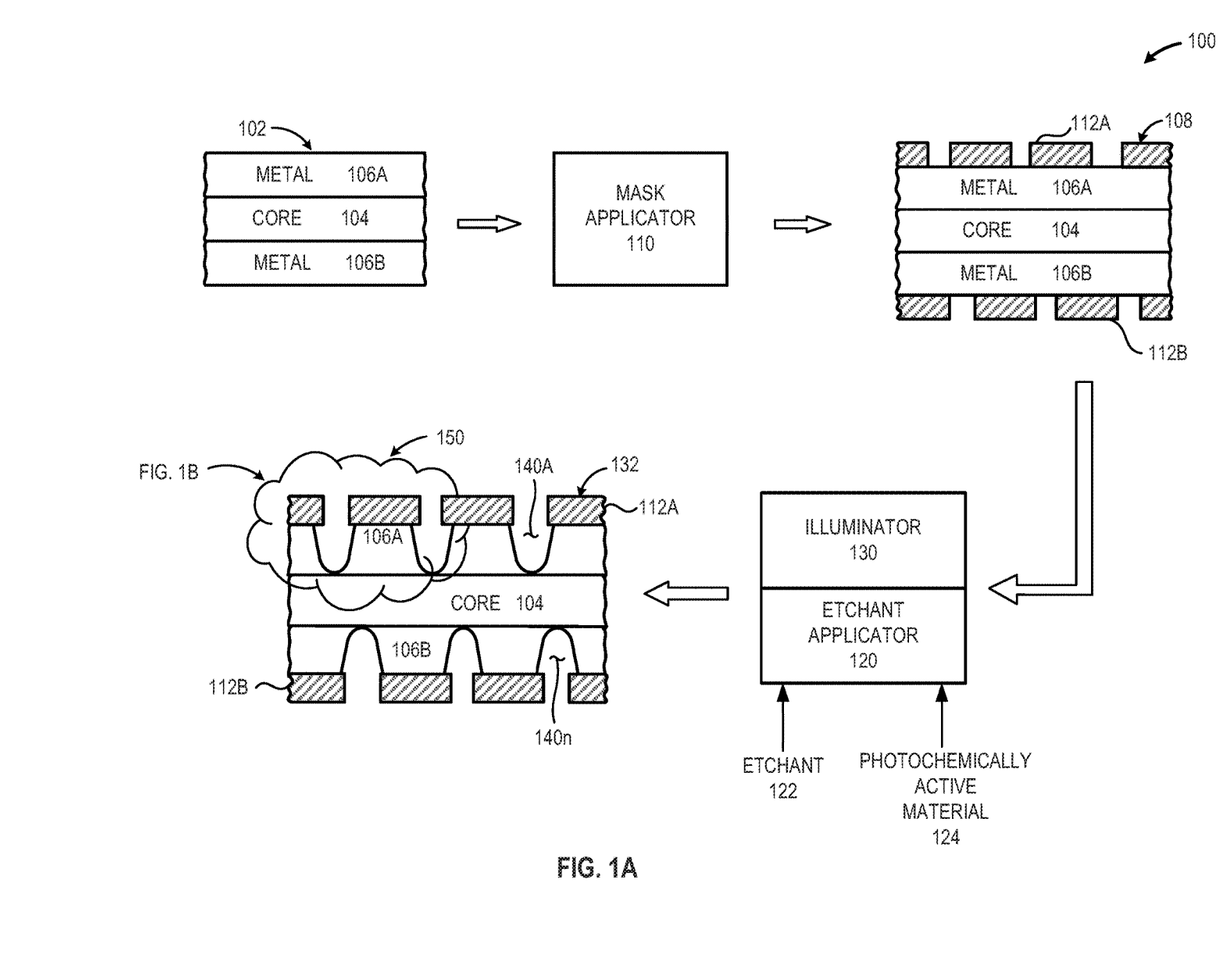
FIG. 1A is a block diagram of an illustrative photochemically enhanced etch system that simultaneously exposes a masked semiconductor substrate to: an etching solution containing a photochemically active material that promotes anisotropic etching of the semiconductor substrate when exposed to electromagnetic energy in a first wavelength band; and an electromagnetic energy source that generates an output across at least a portion of the first wavelength band, in accordance with at least one embodiment described herein.
Figure 1B:
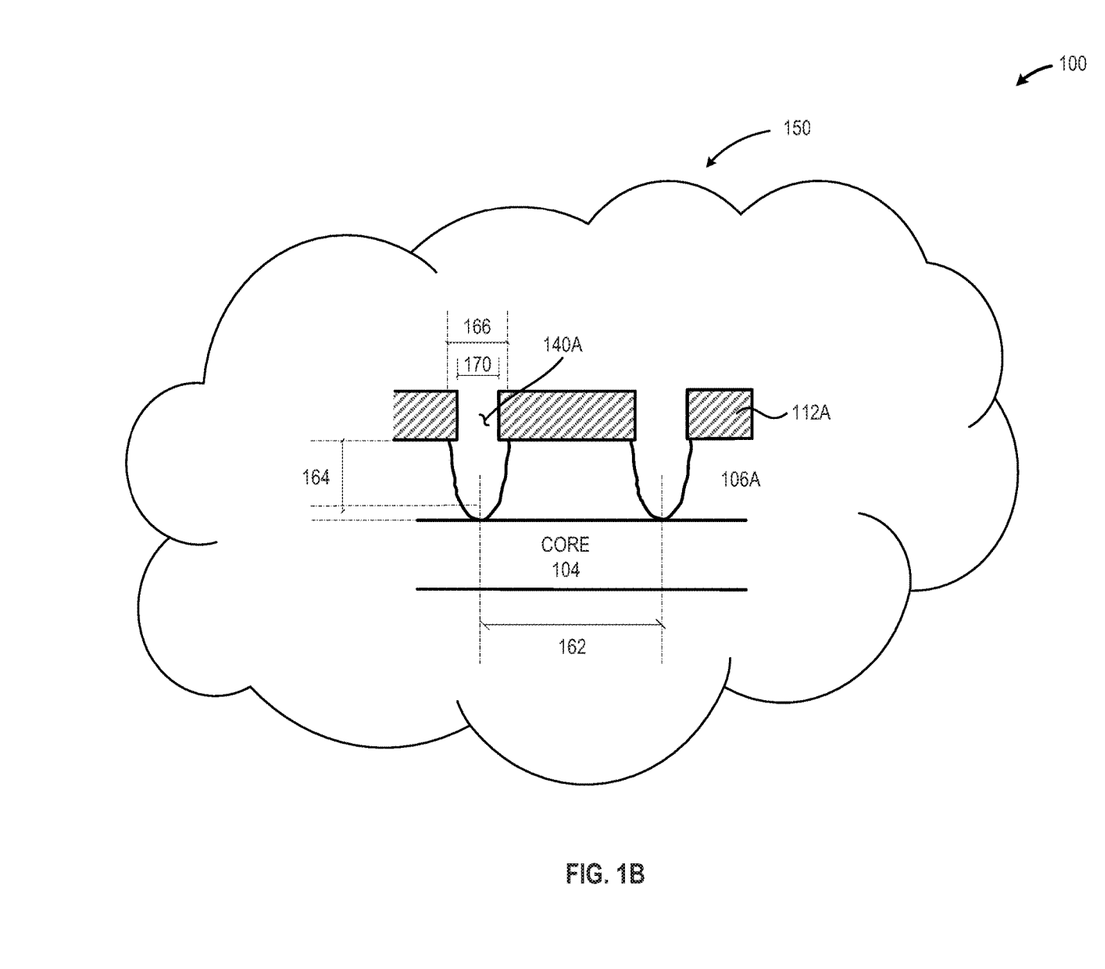
FIG. 1B is an enlarged view of anisotropic voids formed in the semiconductor substrate by the photochemically enhanced etch system depicted in FIG. 1A, in accordance with at least one embodiment described herein.

FIG. 1A is a block diagram of an illustrative photochemically enhanced etch system 100 that simultaneously exposes a masked semiconductor substrate to: an etching solution containing a photochemically active material that promotes anisotropic etching of the semiconductor substrate when exposed to electromagnetic energy in a first wavelength band; and an electromagnetic energy source that generates an output across at least a portion of the first wavelength band, in accordance with at least one embodiment described herein. FIG. 1B is an enlarged view of anisotropic voids formed in the semiconductor substrate by the photochemically enhanced etch system 100 depicted in FIG. 1A, in accordance with at least one embodiment described herein.

As depicted in FIG. 1A, in embodiments, a semiconductor substrate 102 includes a core 104 having a first metal layer 106A disposed on an upper surface of the core 104 and a second metal layer 106B (hereinafter "metal layer 106") disposed on at least a portion of a lower surface of the core 104. The photochemically enhanced etch system 100 includes a mask applicator 110 that is used to pattern a first dry film resist layer 112A across all or a portion of the exposed surface of the first metal layer 106A and a second dry film resist layer 112B (hereinafter "dry film resist layer 112") across all or a portion of the exposed surface of the second metal layer 106B. An etchant applicator 120 and an illuminator 130 receives the patterned semiconductor substrate 118 from the mask applicator 110.

The etchant applicator 120 applies one or more etchant solutions containing one or more photochemically active materials to at least a portion of the dry film resist 112 disposed on the patterned semiconductor substrate 118. Simultaneous with the application of the one or more etchant solutions by the etchant applicator 120, the illuminator 130 exposes the surfaces of the patterned semiconductor substrate 118 to electromagnetic energy in at least a portion of the first wavelength band. The combined effect of the one or more etchant solutions containing the one or more photochemically active materials with the electromagnetic energy in the first wavelength band beneficially causes an anisotropic etching to occur to the metal layer 106 exposed through the dry film resist 112.

Exiting the etchant applicator 120 and the illuminator 130, the etched semiconductor substrate 132 includes anisotropic voids 140A-140n (collectively, "anisotropic voids 140"). In embodiments, the anisotropic voids 140 have a depth that exceeds the lateral dimension (i.e., width) of the anisotropic void 140.

Referring now to FIG. 1B, the anisotropic void 140A produced by the photochemically enhanced etch system 100 has a lateral dimension 166 that is less than the corresponding lateral dimension of an isotropically etched void. Advantageously, the reduced lateral dimension 166 of each anisotropic void permits a reduction in spacing 168 between the voids when compared to conventional, isotropic voids produced using current isotropic etching technologies.

By way of an illustrative example using FIG. 1B, assume gap 170 in dry film resist layer 112A is generally circular with a diameter of about 30 micrometers or "microns" (μm). Assume the depth of the metal layer 106A is 25 μm. To etch through the 25 μm metal layer 106A, an isotropic etching system may create a void 140A having a diameter of about 30 μm (the diameter of gap 170) plus 25 μm on each side of gap 170—a total of approximately 80 μm (30 μm+25 μm+25 μm). In comparison, to etch through the 25 μm metal layer 106A, the anisotropic etching system 100 may create a void 140A having a diameter of about 30 μm (the diameter of gap 170) plus 10 μm on each side of gap 170—a total of approximately 50 μm (30 μm+10 μm+10 μm). The reduction in void diameter 166 permits positioning the voids 140 on a tighter pitch, thereby increasing component density on the semiconductor substrate.

The semiconductor substrate 102 may include any number and/or combination of any currently available and/or future developed core material 104. In embodiments, the core 104 may include an electrically non-conductive or electrically insulative material. The semiconductor substrate 102 may have any size, shape or configuration. The semiconductor substrate 102 may include a single metal layer 106 disposed in, on, about, or across at least a portion of an exposed surface of the core material 104. The semiconductor substrate 102 may include a plurality of metal layers 106A, 106B, each disposed in, on, about, or across at least a portion of a respective exposed surface of the core material 104. For example, in FIG. 1A, the first metal layer 106A is disposed across at least a portion of a first exposed (i.e., upper) surface of the core material 104 and the second metal layer 106B is disposed across at least a portion of the second exposed (i.e., lower) surface of the core material 104.

The metal layer 106 may include one or more electrically conductive materials that may be selectively removed using at least the photochemically enhanced etch system 100 depicted in FIG. 1A. The first metal layer 106A and the second metal layer 106B may include the same or different electrically conductive material. For example, the first metal layer 106A and the second metal layer 106B may each include copper or one or more alloys containing copper. In another example, the first metal layer 106A and the second metal layer 106B may each include an electrically conductive metal and/or metal alloy.

The mask applicator 110 may include any number and/or combination of systems and/or devices capable of depositing and/or patterning a dry film resist layer 112 in, on, or about at least a portion of a metal layer 106 included in the semiconductor substrate 102. For example, the mask applicator 110 may include the systems, apparatuses, and controls to photolithographically deposit the patterned dry film resist on the surface of the semiconductor substrate 102. In another example, the mask applicator 110 may include the systems, apparatuses, and controls to print or otherwise deposit the patterned dry film resist on the surface of the semiconductor substrate 102. In some implementations, the mask applicator 110 may deposit a first dry film resist layer 112A in, on, or about at least a portion of the first metal layer 106A and/or a second dry film resist layer 112B in, on, or about at least a portion of the second metal layer 106B. In some implementations, the dry film resist layer 112 may be formed using one or more materials that absorb at least a portion of the electromagnetic energy in the wavelength band which activates the photochemically active material used in the etchant. In some implementations, the dry film resist layer 112 may be formed using one or more materials that reflect at least a portion of the electromagnetic energy in the wavelength band which activates the photochemically active material used in the etchant.

The etchant applicator 120 may include any number and/or combination of systems and/or devices capable of etching at least a portion of the metal layer 106 exposed through the dry film resist layer 112. In embodiments, the etchant applicator may include one or more directional sprays or spray nozzles that apply, at elevated pressure and/or elevated temperature, an etchant containing the photochemically active material on, about, or across all or a portion of the patterned semiconductor substrate 108. In embodiments, the etchant applicator 120 may include one or more baths, agitated baths or similar immersion-type systems containing, an etchant that includes the photochemically active material.

The etchant 122 used in the etchant applicator 120 may be selected based at least in part on the conductive material or metal used to provide all or a portion of the first metal layer 106A and/or the second metal layer 106B. In some implementations, the etchant 122 used by the etchant applicator 120 may itself be inherently photochemically active, thereby reducing or even eliminating the need for the photochemically active material 124. Etchant spray pressures and/or temperatures may also be selected to optimize the removal of material from the first metal layer 106A and/or the second metal layer 106B. Example etchants include, but are not limited to, solutions containing copper (II) chloride ($CuCl_2$) and solutions containing ferric oxide ($Fe_2O_3$). In at least some implementations, the etchant may be selected based upon the electronic structure of the etchant salt such that the photochemically active material 124 changes the chemical properties of the etchant 122 to enhance the material removal capabilities of the etchant 122 and photochemically active material 124 mixture along at least one axis (e.g., along the axis of incidence of electromagnetic energy provided by the illuminator 130).

The photochemically active material 124 may include any number and/or combination of photochemically active compounds capable of enhancing the effectiveness, efficacy, or efficiency of the etchant along at least one axis. In embodiments, the photochemically active material 124 may enhance the effectiveness, efficacy, or efficiency of the etchant 122 along an axis that is generally normal to (i.e., at an angle of 90°) the surface of the metal layer 106. Example photochemically active materials 124 may include any class of compounds having a redox potential that differs from the copper and/or copper alloys (or other metals/metal alloys) used to provide the metal layer 106. Example, non-limiting, compounds may include most oxidized transition metal ions/metal ligand complexes such as Ferric Oxide, Zinc Oxide, and Cupric Chloride. In some implementations, the photochemically active material 124 may be added to the etchant 122 prior to the etchant applicator 120 applying the etchant to the patterned semiconductor substrate 108 (i.e., a pre-mixed photochemically active material 124). In some implementations the photochemically active material 124 may be added to the etchant 122 at the time the etchant applicator 120 applies the etchant to the patterned semiconductor substrate 108 (i.e., a mixed as applied photochemically active material 124). In some implementations, the photochemically active material 124 may be applied to the surface of the patterned semiconductor substrate 108 after the etchant applicator 120 applies the etchant 122 to the surface of the patterned semiconductor substrate 108 (i.e., a post-mixed photochemically active material 124).

The photochemically active material 124 may include one or more elements, compounds, and/or materials capable of increasing the oxidation/reduction (redox) potential differential between the metal included in the metal layer 106 and the dissolved metal in the etchant 122. For example, where the metal layer 106 includes copper, the photochemically active material 124 may include one or more materials capable of increasing the redox potential difference between the solid copper present in the metal layer 106 and the solubilized copper in the etchant 122.

The ratio of etchant 122 to photochemically active material 124 varies based upon a variety of conditions including, but not limited to, the composition of the metal layer, the composition of the etchant, the temperature and pressure of the etchant when applied to the patterned semiconductor substrate 108, the thickness of the metal layer 106, etc. In embodiments, the ratio (by weight) of etchant 122 to photochemically active material 124 may range from about 10:1 to about 1000:1.

The application temperature and pressure of the at least one etchant 122 and/or the photochemically active material 124 may vary and may be selected or set based on a variety factors, some of which include, but are not limited to: the composition of the at least one etchant 122, the composition of the at least one photochemically active material 124, the concentration of the at least one photochemically active material 124 in the at least one etchant 122, the composition of the dry film resist layer 112, the composition of the metal layer 106, the composition of the core material 104, or combinations thereof. In embodiments, the at least one etchant 122 and the photochemically active material 124 may be applied to the patterned semiconductor substrate 108 at temperatures of: from about 10° C. to about 100° C.; from about 20° C. to about 80° C.; or from about 20° C. to about 60° C. In embodiments, the at least one etchant 122 and the at least one photochemically active material 124 may be applied to the patterned semiconductor substrate 108 using a pressurized spray system. In such embodiments, the at least one etchant 122 and the photochemically active material 124 may be applied to the patterned semiconductor substrate 108 at a pressure of: from about 5 pounds per square inch gauge (psig) to about 200 psig; from about 10 psig to about 150 psig; or from about 10 psig to about 100 psig.

The illuminator 130 may include any number and/or combination of systems and/or devices capable of providing electromagnetic energy in a wavelength band sufficient to activate the photochemically active material 124. In some implementations, the electromagnetic energy emitted by the illuminator 130 may impinge on the patterned semiconductor substrate 108 at about a 90° angle measured with respect to the surface of the metal layer 106. In some implementations, the electromagnetic energy emitted by the illuminator 130 may be coaxial with the etchant 122 and/or photochemically active material 124 emitted by the etchant applicator 120. In some implementations, the axis of the electromagnetic energy emitted by the illuminator 130 may be varied. In some implementations, the illuminator 130 may continuously illuminate the patterned semiconductor substrate 108 as the patterned semiconductor substrate 108 passes through at least a portion of the etchant applicator 120. In some implementations, the illuminator 130 may be periodically, aperiodically, or intermittently illuminated by the illuminator 130 as the patterned semiconductor substrate 108 passes through at least a portion of the etchant applicator 120.

The illuminator 130 may emit electromagnetic energy at one or more wavelengths. In some implementations, the illuminator 130 may emit electromagnetic energy at one or more wavelengths having sufficient energy to bridge the band gap of the etchant in the etchant solution from the highest occupied electron orbital to the lowest unoccupied electron orbital. For example, the illuminator 130 may emit electromagnetic energy having sufficient energy to cause the electron in the highest occupied orbital in a $CuCl_2$ solution to bridge the band gap to the next lowest unoccupied orbital. Boosting the electron in the etchant 122 beneficially increases the etch rate of the etchant 122. Since the etch rate enhancement is a direct consequence of the energy provided by the electromagnetic energy provided by the illuminator 130, only the etchant 122 exposed to the direct impingement of the electromagnetic energy will experience the enhanced etch rate while those areas that are not exposed to the direct impingement of the electromagnetic energy (e.g., the portion of the etchant 122 shaded by the dry film resist layer 112) will etch at the lower, unenhanced, etch rate. In embodiments, the etch rate enhancement attributable to the electromagnetic energy emitted by the illuminator 130 may occur even in the absence of the photochemically active material 124.

Figure 2:
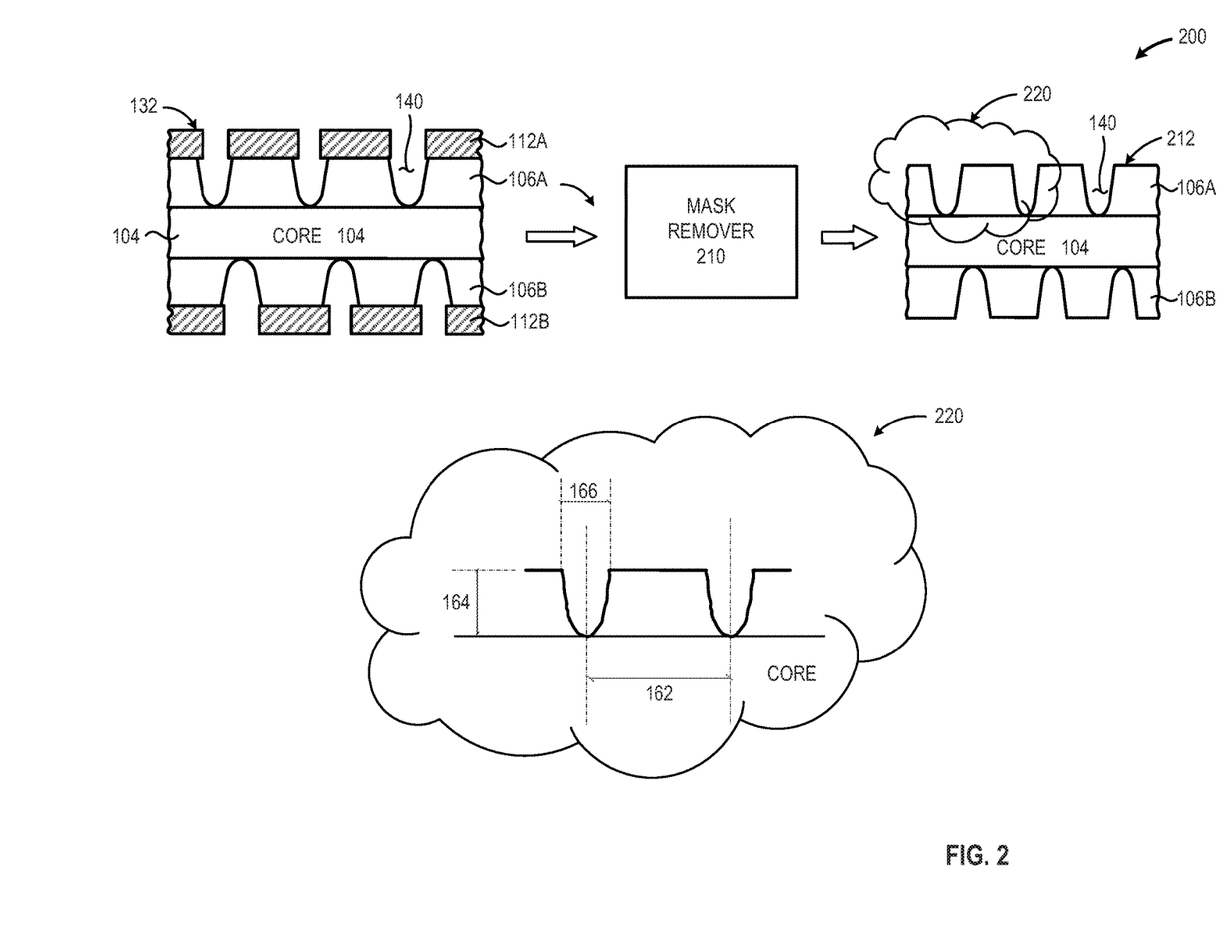
FIG. 2 is a block diagram of an illustrative etched semiconductor substrate finishing system that may be used in conjunction with the photochemically enhanced etch system depicted in FIG. 1A, in accordance with at least one embodiment described herein.

FIG. 2 is a block diagram of an illustrative etched semiconductor substrate 132 finishing system 200 that may be used in conjunction with the photochemically enhanced etch system 100 depicted in FIG. 1A, in accordance with at least one embodiment described herein. A mask remover 210 receives the etched semiconductor substrate 132 and removes at least a portion of the dry film resist layer 112 from the surface of the metal layer 106. In some implementations, the mask remover 210 removes all of the dry film resist layer 112 from the surface of the metal layer 106. The resultant finished semiconductor substrate 212 includes a metal layers 106 having a plurality of voids 140 formed therein.

In embodiments, the voids 140 in the metal layer 106 in the finished semiconductor substrate 212 may have a diameter 166 of from about 20 nanometers (nm) to about 100 nm, about 30 nm to about 70 nm, or about 40 nm to about 60 nm. In embodiments, the voids 140 in the metal layer 106 in the finished semiconductor substrate 212 may have a pitch 162 (e.g., center to center spacing) of from about 50 nanometers (nm) to about 200 nm, about 70 nm to about 150 nm; or about 90 nm to about 120 nm.

The mask remover 210 may include any number and/or combination of systems and/or devices capable of removing all or a portion of the dry film resist layer 112 from the surface of the metal layer 106. The mask remover 210 may remove the dry film resist layer 112 chemically or mechanically. In some implementations, the mask remover may use chemical-mechanical planarization to remove all or a portion of the dry film resist layer 112 from the surface of the metal layer 106. The mask remover 210 may remove the dry film resist layer 112 from the surface of the metal layer 106 on a continuous, semi-continuous, or batch basis.

Figure 3A:
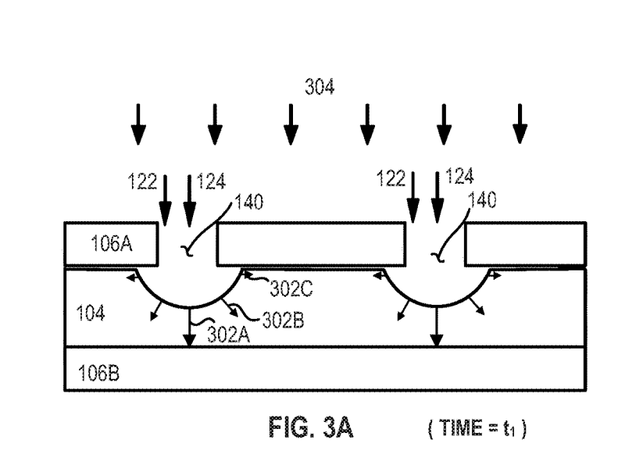
FIG. 3A is a partial cross-sectional elevation of a system in which voids are created in a metal layer of the patterned semiconductor substrate, at time=$t_1$, using an example photochemically enhanced etching system such as that illustrated in FIGS. 1A, 1B, and 2, in accordance with at least one embodiment described herein.

FIG. 3A is a partial cross-sectional elevation of a system 300A in which voids are created in a metal layer 106 of the patterned semiconductor substrate 108, at time=$t_1$, using an example photochemically enhanced etching system such as that illustrated in FIGS. 1A, 1B, and 2, in accordance with at least one embodiment described herein. As depicted in FIG. 3A, at least one etchant 122 and at least one photochemically active material 124 are applied to the surface of the masked semiconductor substrate 108. An illuminator 130, simultaneous with the application of the at least one etchant 122 and the at least one photochemically active material 124, emits electromagnetic energy 304 that calls on the surface of the masked semiconductor substrate 108 coincident with the at least one etchant 122 and the at least one photochemically active material 124.

The incident electromagnetic energy 304 interacts with the at least one photochemically active material 124 to cause the at least one etchant 122 to selectively and preferentially remove metal from the metal layer 106 in a direction that aligns with the axis of application of the at least one etchant 122 and the axis of incidence of the electromagnetic energy 304. The arrows extending outward from the void 140 provide a relative indication of the etch rate in directions extending radially outward from the void 140. The highest etch rate 302A extends vertically downward from the void 140. Thus, metal is rapidly removed from the metal layer 106A in a downward direction (i.e., towards the core material 104). The lowest etch rate 302C extends horizontally outward from the void 140. Note the areas demonstrating the lowest etch rate do not align with either the axis of application of the at least one etchant 122 or the axis of incidence of the electromagnetic energy 304. Intermediate etch rates 302B occur elsewhere along the periphery of the void 140.

Figure 3B:
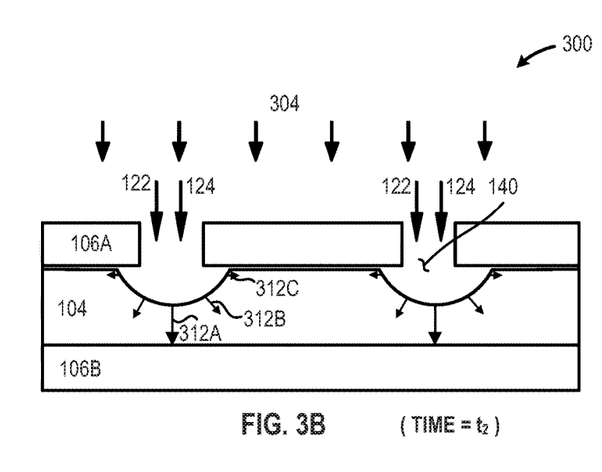
FIG. 3B is a partial cross-sectional elevation of a system in which voids are created in a metal layer of the patterned semiconductor substrate, at time=$t_2$, using an example photochemically enhanced etching system such as that illustrated in FIGS. 1A, 1B, and 2, in accordance with at least one embodiment described herein.

FIG. 3B is a partial cross-sectional elevation of a system 300B in which voids are created in a metal layer 106 of the patterned semiconductor substrate 108, at time=$t_2$, using an example photochemically enhanced etching system such as that illustrated in FIGS. 1A, 1B, and 2, in accordance with at least one embodiment described herein. At least one etchant 122 and at least one photochemically active material 124 are applied to the surface of the masked semiconductor substrate 108. The illuminator 130, simultaneous with the application of the at least one etchant 122 and the at least one photochemically active material 124, emits electromagnetic energy 304 that falls on the surface of the masked semiconductor substrate 108 coincident with the at least one etchant 122 and the at least one photochemically active material 124.

The incident electromagnetic energy 304 interacts with the at least one photochemically active material 124 to cause the at least one etchant 122 to selectively and preferentially remove metal from the metal layer 106 in a direction that aligns with the axis of application of the at least one etchant 122 and the axis of incidence of the electromagnetic energy 304. The arrows 312A-312C extending outward from the void 140 provide a relative indication of the etch rate in directions extending radially outward from the void 140. Once again, the greatest etch rate 312A typically will extend vertically downward from the void 140. Thus, material is quickly removed from the metal layer 106A in a downward direction (e.g., towards the core material 104). The least or lowest etch rate 312C extends horizontally outward from the void 140. Note the portions of the void periphery demonstrating a reduced etch rate typically do not align with either the axis of application of the at least one etchant 122 or the axis of incidence of the electromagnetic energy 304. Intermediate etch rates 312B occur elsewhere along the periphery of the void 140.

Figure 3C:
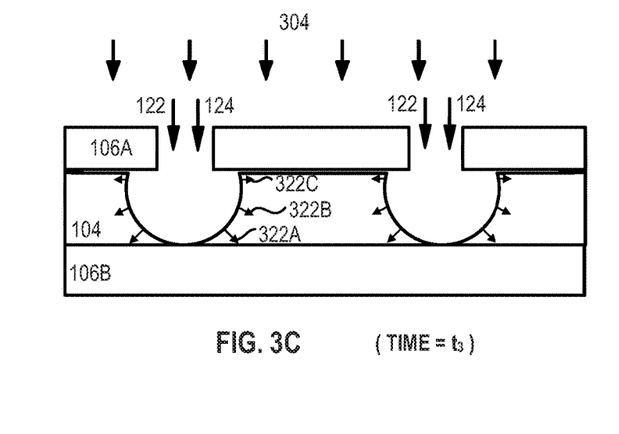
FIG. 3C is a partial cross-sectional elevation of a system in which voids are created in a metal layer of the patterned semiconductor substrate, at time=$t_3$, using an example photochemically enhanced etching system such as that illustrated in FIGS. 1A, 1B, and 2, in accordance with at least one embodiment described herein.

FIG. 3C is a partial cross-sectional elevation of a system 300C in which voids are created in a metal layer 106 of the patterned semiconductor substrate 108, at time=$t_3$, using an example photochemically enhanced etching system such as that illustrated in FIGS. 1A, 1B, and 2, in accordance with at least one embodiment described herein. At least one etchant 122 and at least one photochemically active material 124 are applied to the surface of the masked semiconductor substrate 108. The illuminator 130, simultaneous with the application of the at least one etchant 122 and the at least one photochemically active material 124, emits electromagnetic energy 304 that falls on the surface of the masked semiconductor substrate 108 coincident with the at least one etchant 122 and the at least one photochemically active material 124.

As depicted in FIG. 3C, the void 140 has reached the core material 104. Etching continues, at reduced etch rates, in a radially outward direction. The etch rates 322A-322C are roughly equal with material removed from metal layer 106A being roughly equal in all radial directions.

Figure 3D:
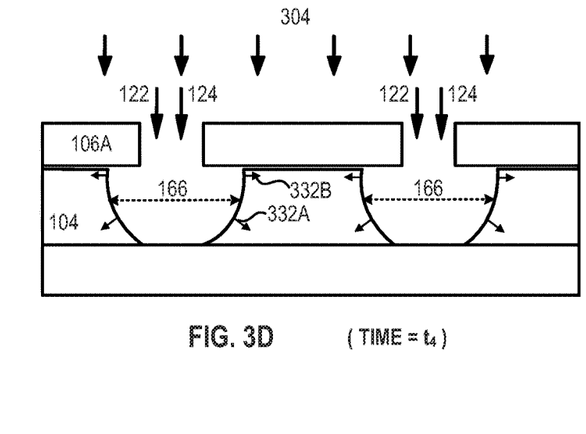
FIG. 3D is a partial cross-sectional elevation of a system in which voids are created in a metal layer of the patterned semiconductor substrate, at time=$t_4$, using an example photochemically enhanced etching system such as that illustrated in FIGS. 1A, 1B, and 2, in accordance with at least one embodiment described herein.

FIG. 3D is a partial cross-sectional elevation of a system 300D in which voids are created in a metal layer 106 of the patterned semiconductor substrate 108, at time=$t_4$, using an example photochemically enhanced etching system such as that illustrated in FIGS. 1A, 1B, and 2, in accordance with at least one embodiment described herein. At least one etchant 122 and at least one photochemically active material 124 are applied to the surface of the masked semiconductor substrate 108. The illuminator 130, simultaneous with the application of the at least one etchant 122 and the at least one photochemically active material 124, emits electromagnetic energy 304 that falls on the surface of the masked semiconductor substrate 108 coincident with the at least one etchant 122 and the at least one photochemically active material 124.

As depicted in FIG. 3D, the void 140 has reached the core material 104. Etching continues, albeit at reduced etch rates, in a radially outward direction. The etch rates 332A-332B are roughly equal with material removed from metal layer 106A being roughly equal in all radial directions. The diameter of the void 166 may be set to any desired dimension by adjusting the application rate of the at least one etchant 122, the at least one photochemically active material 124, and/or the electromagnetic energy 304 emitted by the illuminator 130.

Figure 4:
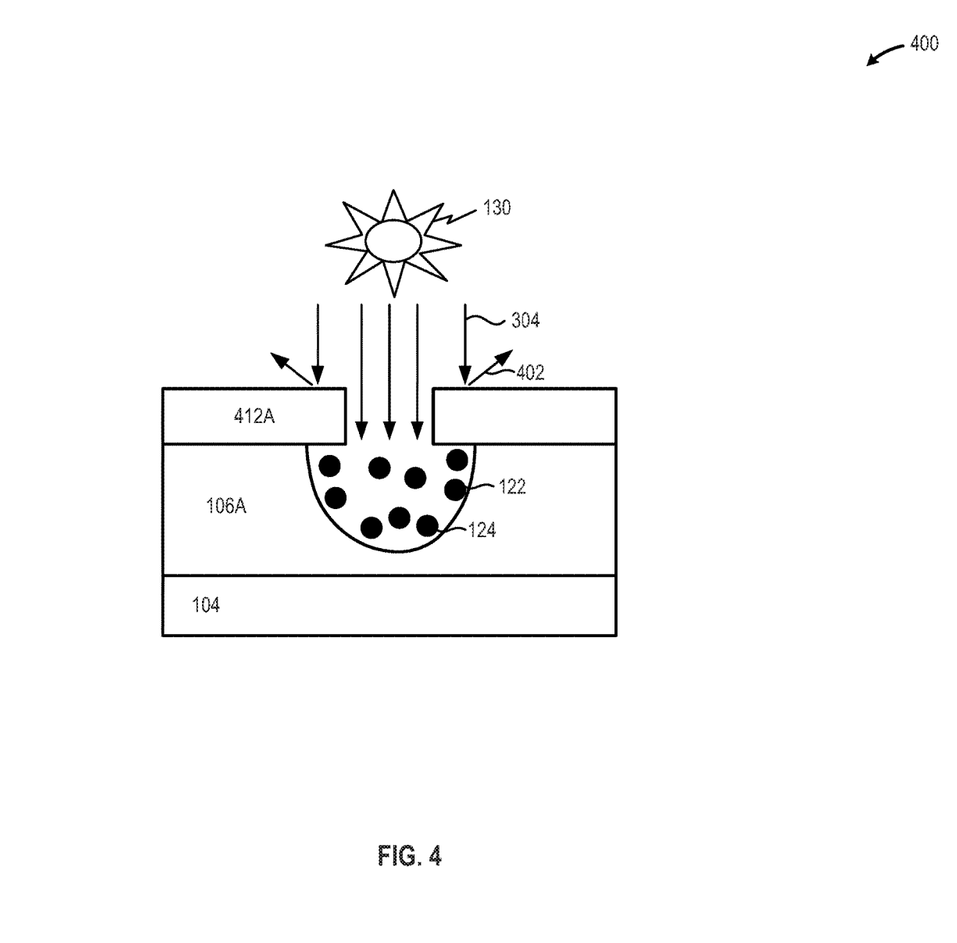
FIG. 4 is a partial cross-sectional elevation of a system that includes a patterned dry film resist layer that includes one or more materials capable of reflecting at least a portion of the incident electromagnetic energy provided by the illuminator, in accordance with at least one embodiment described herein.

FIG. 4 is a partial cross-sectional elevation of a system 400 that includes a patterned dry film resist layer 412A that includes one or more materials capable of reflecting 402 at least a portion of the incident electromagnetic energy 304 provided by the illuminator 130, in accordance with at least one embodiment described herein. In some implementations, one or more materials capable of reflecting 402 at least a portion of the incident electromagnetic energy 304 produced by the illuminator 130 may be combined, mixed, or otherwise dispersed in the patterned dry film resist layer 412A. Incorporating one or more materials capable of reflecting 402 at least a portion of the incident electromagnetic energy 304 provided by the illuminator 130 beneficially limits or reduces the interaction between the electromagnetic energy 304 and the photochemically active material 124 along the sides of the void 140, thereby further reducing the less desirable undercut etching beneath the patterned dry film resist layer 412A.

In some implementations, one or more materials capable of absorbing all or a portion of the incident electromagnetic energy 304 provided by the illuminator 130 may be combined, mixed, or otherwise dispersed in the patterned dry film resist layer 412A. Incorporating one or more materials capable of absorbing some or all of the incident electromagnetic energy 304 provided by the illuminator 130 beneficially limits or reduces the interaction between the electromagnetic energy 304 and the photochemically active material 124 along the sides of the void 140, thereby further reducing the less desirable undercut etching beneath the patterned dry film resist layer 412A.

Figure 5:
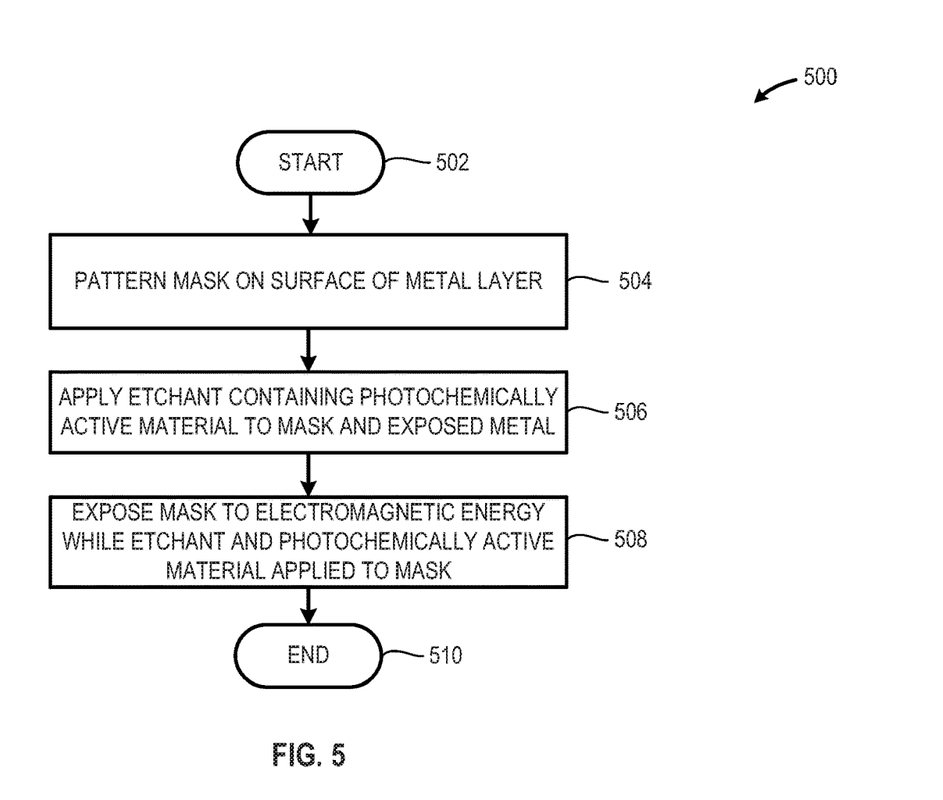
FIG. 5 is a high-level flow diagram of an illustrative electromagnetically enhanced semiconductor substrate etching method using at least one etchant and at least one photochemically active material applied to a patterned semiconductor substrate simultaneous with electromagnetic energy produced by an illuminate, in accordance with at least one embodiment described herein.

FIG. 5 is a high-level flow diagram of an illustrative electromagnetically enhanced semiconductor substrate etching method 500 using at least one etchant 122 and at least one photochemically active material 124 applied to a patterned semiconductor substrate 108 simultaneous with electromagnetic energy produced by an illuminate 130, in accordance with at least one embodiment described herein. The combination of the at least one etchant 122 and the at least one photochemically active material 124 with the electromagnetic energy 304 produced by the illuminator 130 beneficially and advantageously improves directional etching capabilities, thereby permitting the formation of smaller, more densely spaced voids in semiconductor substrates. The ability to form more closely spaced (i.e., more densely packed) voids in the semiconductor substrate permits a higher component density on the semiconductor substrate, thereby facilitating the miniaturization of integrated circuits and other components incorporating semiconductor dies. The method 500 commences at 502.

At 504, a patterned mask 112 is applied to at least a portion of the surface of a metal layer 106. In some instances, the metal layer 106 may be disposed proximate a core material 104. In other instances, the metal layer 106 may represent an intermediate layer in a multi-layer laminated structure, such as a printed circuit board or similar. The patterned mask 112 may be applied using any technology, such as photolithography, printing, and similar. In some implementations, a dry film resist layer may form all or a portion of the patterned mask 112. In some implementations, the patterned mask 112 may include one or more materials that reflect at least a portion of a first wavelength band containing the electromagnetic energy used to activate the at least one photochemically active material 124. In some implementations, the patterned mask 112 may include one or more materials that absorb at least a portion of a first wavelength band containing the electromagnetic energy used to activate the at least one photochemically active material 124.

At 506, at least one etchant 122 and at least one photochemically active material 124 are applied to the patterned semiconductor substrate 108. In embodiments, the at least one etchant 122 and the at least one photochemically active material 124 may be pre-mixed and applied as a mixture to the patterned semiconductor substrate 108. In other embodiments, the at least one etchant 122 and the at least one photochemically active material 124 may be applied separately, but simultaneously to the patterned semiconductor substrate 108. In other embodiments, the at least one etchant 122 and the at least one photochemically active material 124 may be applied at separate times to the patterned semiconductor substrate 108. In embodiments, the at least one etchant 122 and/or the at least one photochemically active material 124 may be applied to the patterned semiconductor substrate 108 at temperatures greater than ambient (e.g., temperatures of 35° C. to 100° C.). In embodiments, the at least one etchant and/or the at least one photochemically active material 124 may be applied to the patterned semiconductor substrate 108 at elevated pressures (e.g., 10 psig to 100 psig) to enhance the removal of material from the metal layer 106. In embodiments, the at least one etchant 122 and/or the at least one photochemically active material 124 may be applied to the patterned semiconductor substrate 108 at elevated pressures via one or more spray nozzles.

At 508, the patterned semiconductor substrate 108 is exposed to electromagnetic energy 304 in a first wavelength band simultaneous with the application of the at least one etchant 122 and the at least one photochemically active material 124 to the patterned semiconductor substrate 108. In implementations, all or a portion of the first wavelength band may fall within the visible spectrum (i.e., wavelengths between 390 nanometers (nm) and 700 nm). In other implementations, the first wavelength band may fall outside of the visible spectrum. For example, all or a portion of the first wavelength band may fall within the ultraviolet spectrum (i.e., below 390 nm) or within the infrared spectrum (i.e., above 700 nm). In some instances, the first wavelength band may be a narrow band around a center wavelength. For example, the first wavelength band may be a center (or target) wavelength plus or minus 10 nm to 100 nm. In other instances, the first wavelength band may include a broad spectral band having a fairly even spectral distribution within the band. In embodiments, the illuminator 130 may supply electromagnetic energy 304 contemporaneous with the application of the at least one etchant 122 and the at least one photochemically active material 124 to the surface of the patterned semiconductor substrate 108.

The illuminator 130 producing the electromagnetic energy 304 in the first wavelength band may provide a directional electromagnetic output such that the electromagnetic energy incident upon the patterned semiconductor substrate 108 is at a fixed angle (e.g., 90° or normal with respect to the surface of the metal layer 106). In embodiments, the illuminator may provide a selectively adjustable directional electromagnetic output that can be used to provide a variety of angles of incidence of the electromagnetic energy 304 on the surface of the patterned semiconductor substrate 108. The method 500 concludes at 510.

Figure 6:
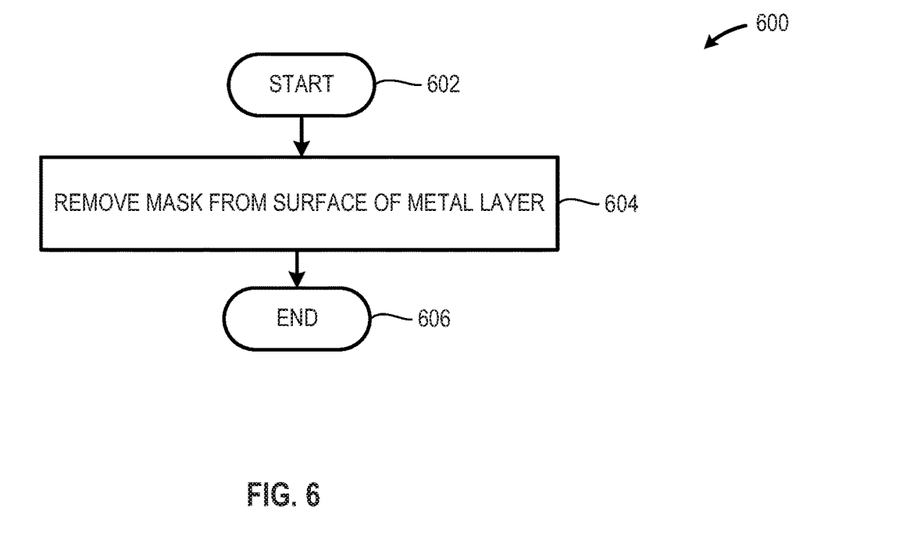
FIG. 6 is a high-level flow diagram of an illustrative electromagnetically enhanced semiconductor substrate etching method using mask remover to remove at least a portion of the dry film resist layer from the etched semiconductor substrate, in accordance with at least one embodiment described herein.

FIG. 6 is a high-level flow diagram of an illustrative electromagnetically enhanced semiconductor substrate etching method 600 using mask remover 210 to remove at least a portion of the dry film resist layer 112 from the etched semiconductor substrate 132, in accordance with at least one embodiment described herein. FIG. 6 may be used in conjunction with the method 500 described in detail above with regard to FIG. 5. The method 600 commences at 602.

At 604, the mask remover 210 removes all or a portion of the patterned dry film resist layer 112 from the surface of the metal layer 106. In some implementations, the mask remover 210 may chemically remove all or a portion of the patterned dry film resist 112 to provide the etched semiconductor substrate 212. In some implementations, the mask removed 210 may mechanically remove all or a portion of the patterned dry film resist layer 112 to provide the etched semiconductor substrate 212. In some implementations, the mask remover 210 may chemically and mechanically remove all or a portion of the patterned dry film resist 112 to provide the etched semiconductor substrate 212. For example, using chemical-mechanical planarization. The method 600 concludes at 606.

While FIGS. 5 and 6 illustrate various operations according to one or more embodiments, it is to be understood that not all of the operations depicted in FIGS. 5 and 6 are necessary for other embodiments. Indeed, it is fully contemplated herein that in other embodiments of the present disclosure, the operations depicted in FIGS. 5 and 6, and/or other operations described herein, may be combined in a manner not specifically shown in any of the drawings, but still fully consistent with the present disclosure. Thus, claims directed to features and/or operations that are not exactly shown in one drawing are deemed within the scope and content of the present disclosure.

As used in this application and in the claims, a list of items joined by the term "and/or" can mean any combination of the listed items. For example, the phrase "A, B and/or C" can mean A; B; C; A and B; A and C; B and C; or A, B and C. As used in this application and in the claims, a list of items joined by the term "at least one of" can mean any combination of the listed terms. For example, the phrases "at least one of A, B or C" can mean A; B; C; A and B; A and C; B and C; or A, B and C.

As used in any embodiment herein, the terms "system" or "module" may refer to, for example, software, firmware and/or circuitry configured to perform any of the aforementioned operations. Software may be embodied as a software package, code, instructions, instruction sets and/or data recorded on non-transitory computer readable storage mediums. Firmware may be embodied as code, instructions or instruction sets and/or data that are hard-coded (e.g., non-volatile) in memory devices. "Circuitry", as used in any embodiment herein, may comprise, for example, singly or in any combination, hardwired circuitry, programmable circuitry such as computer processors comprising one or more individual instruction processing cores, state machine circuitry, and/or firmware that stores instructions executed by programmable circuitry or future computing paradigms including, for example, massive parallelism, analog or quantum computing, hardware embodiments of accelerators such as neural net processors and non-silicon implementations of the above. The circuitry may, collectively or individually, be embodied as circuitry that forms part of a larger system, for example, an integrated circuit (IC), system on-chip (SoC), desktop computers, laptop computers, tablet computers, servers, smartphones, etc.

Any of the operations described herein may be implemented in a system that includes one or more mediums (e.g., non-transitory storage mediums) having stored therein, individually or in combination, instructions that when executed by one or more processors perform the methods. Here, the processor may include, for example, a server CPU, a mobile device CPU, and/or other programmable circuitry. Also, it is intended that operations described herein may be distributed across a plurality of physical devices, such as processing structures at more than one different physical location. The storage medium may include any type of tangible medium, for example, any type of disk including hard disks, floppy disks, optical disks, compact disk read-only memories (CD-ROMs), compact disk rewritables (CD-RWs), and magneto-optical disks, semiconductor devices such as read-only memories (ROMs), random access memories (RAMs) such as dynamic and static RAMs, erasable programmable read-only memories (EPROMs), electrically erasable programmable read-only memories (EEPROMs), flash memories, Solid State Disks (SSDs), embedded multimedia cards (eM-MCs), secure digital input/output (SDIO) cards, magnetic or optical cards, or any type of media suitable for storing electronic instructions. Other embodiments may be implemented as software executed by a programmable control device.

Thus, the present disclosure is directed to systems and methods for providing anisotropic or directional etching in semiconductor substrate fabrication. Current etching technology limits component density based on the diameter of the void created by isotropic (i.e., roughly equal in all directions) etching technology. The use of anisotropic or directional etching advantageously enables the selective etching of a semiconductor substrate in a preferred or selected direction, reducing the diameter of the void created in the semiconductor substrate and beneficially enabling greater component density on the semiconductor substrate. The systems and methods described herein use at least one etchant and at least one photochemically active material in conjunction with electromagnetic energy applied simultaneous with the etchant and photochemically active material during the etching process. The interaction between the electromagnetic energy and the photochemically active material preferentially increases the etch rate in a direction along the axis of incidence of the electromagnetic energy, thereby permitting the anisotropic formation of voids within the semiconductor substrate. These anisotropic voids may be more closely spaced (i.e., arranged on a tighter pitch) than the isotropic voids produced using conventional etching technologies. By placing the voids in the semiconductor substrate on a tighter pitch, greater component density may be achieved.

The following examples pertain to further embodiments. The following examples of the present disclosure may comprise subject material such as at least one device, a method, at least one machine-readable medium for storing instructions that when executed cause a machine to perform acts based on the method, means for performing acts based on the method and/or a system for anisotropically etching metal layers forming a portion of a semiconductor substrate.

According to example 1, there is provided an anisotropic metal etching method to preferentially remove metal along a defined axis. The method may include patterning a mask on a surface of a metal layer; and anisotropically etching exposed portions of the surface of the metal layer by: applying an etchant to the exposed portions of the surface of the metal layer, the etchant including at least one photochemically active material to selectively enhance a removal of metal from the exposed portions of the surface of the metal layer along an axis of incidence of electromagnetic energy in a first spectral band; and exposing the exposed portions of the surface of the metal layer to electromagnetic energy in the first spectral band contemporaneous with applying the etchant to form a plurality of voids in the exposed portions of the surface of the metal layer.

Example 2 may include elements of example 1 where patterning a mask on a surface of a metal layer may include patterning the mask on a surface of a copper layer.

Example 3 may include elements of example 2 where patterning the mask on a surface of a copper layer may include patterning the mask on the surface of a copper layer disposed at least partially across a surface of a core material.

Example 4 may include elements of example 3 where patterning the mask on the surface of a copper layer disposed at least partially across a surface of a core material may include patterning a dry film resist on the surface of the copper layer.

Example 5 may include elements of example 4 where patterning a dry film resist on the surface of the copper layer may include patterning a dry film resist on the surface of the copper layer disposed at least partially across a surface of a core material, the dry film resist having at least one of: a high absorption or a high reflectivity of electromagnetic energy in the first spectral band.

Example 6 may include elements of example 5 where applying an etchant including at least one photochemically active material may include applying an etchant comprising a photochemically active material containing an oxidized transition metal ion or metal ligand complex selected from the group consisting of: $Fe^{3+}$ (ferric), $Zn^{2+}$ (zinc), and $Cu^{2+}$ (cupric) ions.

Example 7 may include elements of example 4 where exposing the exposed portions of the surface of the metal layer to electromagnetic energy in the first spectral band contemporaneous with applying the etchant may include exposing the exposed portions of the surface of the metal layer to electromagnetic energy in the first spectral band normally incident on the exposed portions of the surface of the metal layer to provide an anisotropic etch in which metal is preferentially removed from exposed surface of the metal layer along an axis normal to the core material.

Example 8 may include elements of example 7, and the method may further include removing at least a portion of the dry film resist from at least a portion of the surface of the metal layer.

Example 9 may include elements of example 1 where patterning a mask on the surface of a metal layer may include photolithographically patterning the mask on at least a portion of the surface of the metal layer.

Example 10 may include elements of example 1 where applying an etchant to the exposed portions of the surface of the metal layer may include spraying an etchant under pressure against at least the exposed portions of the surface of the metal layer, at least a portion of the etchant applied along an axis parallel to the axis of incidence of the electromagnetic energy on the exposed portions of the surface of the metal layer.

Example 11 may include elements of example 1 where exposing the exposed portions of the surface of the metal layer to electromagnetic energy in the first spectral band contemporaneous with applying the etchant to form a plurality of voids in the exposed portions of the surface of the metal layer may include exposing the exposed portions of the surface of the metal layer to electromagnetic energy in the first spectral band contemporaneous with applying the etchant to form a plurality of voids, each of the plurality of voids having a diameter of from about 50 micrometers to about 60 micrometers and a pitch of from about 100 micrometers to about 120 micrometers.

According to example 12, there is provided an anisotropic etching system to preferentially remove material along a defined axis, the system may include an etchant applicator to apply an etchant that includes at least one photochemically active material to a mask disposed on a surface of a metal layer and to an exposed portion of the surface of the metal layer; and an illuminator to expose at least the exposed portion of the surface of the metal layer to electromagnetic energy in a first spectral band contemporaneous with application of the etchant by the etchant applicator, the electromagnetic energy in the first spectral band to selectively enhance a removal of metal from the surface of the metal layer along an axis of incidence of electromagnetic energy to form a plurality of voids in the metal layer.

Example 13 may include elements of example 12 where the metal layer may include a copper layer and the etchant applicator to apply the etchant that includes at least one photochemically active material to the mask and to the exposed portions of the surface of the copper layer.

Example 14 may include elements of example 13 and the etchant applicator may apply the etchant to the mask and to the exposed portion of a surface of a copper layer disposed at least partially across a surface of a core material.

Example 15 may include elements of example 14 and the etchant applicator may apply the etchant to a patterned dry film resist and to the exposed portion of a surface of the copper layer disposed at least partially across the surface of a core material.

Example 16 may include elements of example 15 and the etchant applicator may apply the etchant to a patterned dry film resist and to the exposed portion of a surface of the copper layer disposed at least partially across the surface of a core material, and the dry film resist may have at least one of: a high absorption or a high reflectivity of electromagnetic energy in the first spectral band.

Example 17 may include elements of example 16 and the etchant applicator may apply an etchant comprising a photochemically active material containing an oxidized transition metal ion or metal ligand complex selected from the group consisting of: $Fe^{3+}$ (ferric), $Zn^{2+}$ (zinc), and $Cu^{2+}$ (cupric) ions.

Example 18 may include elements of example 17 and the illuminator may expose at least the exposed portion of the surface of the metal layer to electromagnetic energy in a first spectral band normally incident on the dry film resist to provide an anisotropic etch in which metal is preferentially removed from the surface of the metal layer along an axis normal to the core material.

Example 19 may include elements of example 12 and the etchant applicator may apply the etchant that includes the at least one photochemically active material to a photolithographically patterned dry film resist and to the exposed portion of the surface of the metal layer.

Example 20 may include elements of example 12 and the etchant applicator may apply an etchant via spray against the mask, at least a portion of the etchant applied along an axis parallel to the axis of incidence of the electromagnetic energy in the first spectral band.

Example 21 may include elements of example 12 and the illuminator may expose at least the exposed portion of the surface of the metal layer to electromagnetic energy in a first spectral band to form the plurality of voids in the surface of the metal layer wherein each of the plurality of voids may have a diameter of from about 50 micrometers to about 60 micrometers and a pitch of from about 100 micrometers to about 120 micrometers.

According to example 22, there is provided an anisotropic etching system to preferentially remove metal along a defined axis. The system may include: a means for patterning a mask on a surface of a metal layer; and a means for applying an etchant to the exposed portions of the surface of the metal layer, the etchant including at least one photochemically active material to selectively enhance a removal of metal from the exposed portions of the surface of the metal layer along an axis of incidence of electromagnetic energy in a first spectral band; and a means for exposing the exposed portions of the surface of the metal layer to electromagnetic energy in the first spectral band contemporaneous with applying the etchant to form a plurality of voids in the exposed portions of the surface of the metal layer.

Example 23 may include elements of example 22 where the means for patterning a mask on a surface of a metal layer may include a means for patterning the mask on a surface of a copper layer.

Example 24 may include elements of example 23 where the means for patterning the mask on a surface of a copper layer may include a means for patterning the mask on the surface of a copper layer disposed at least partially across a surface of a core material.

Example 25 may include elements of example 24 where the means for patterning the mask on the surface of a copper layer disposed at least partially across a surface of a core material may include a means for patterning a dry film resist on the surface of the copper layer.

Example 26 may include elements of example 25 where the means for patterning a dry film resist on the surface of the copper layer may include a means for patterning a dry film resist on the surface of the copper layer disposed at least partially across a surface of a core material, the dry film resist having at least one of: a high absorption or a high reflectivity of electromagnetic energy in the first spectral band.

Example 27 may include elements of example 26 where the means for applying an etchant including at least one photochemically active material may include a means for applying an etchant comprising a photochemically active material containing an oxidized transition metal ion or metal ligand complex selected from the group consisting of: $Fe^{3+}$ (ferric), $Zn^{2+}$ (zinc), and $Cu^{2+}$ (cupric) ions.

Example 28 may include elements of example 25 where the means for exposing the exposed portions of the surface of the metal layer to electromagnetic energy in the first spectral band contemporaneous with applying the etchant may include a means for exposing the exposed portions of the surface of the metal layer to electromagnetic energy in the first spectral band normally incident on the exposed portions of the surface of the metal layer to provide an anisotropic etch in which metal is preferentially removed from exposed surface of the metal layer along an axis normal to the core material.

Example 29 may include elements of example 28 and the system may further include a means for removing at least a portion of the dry film resist from at least a portion of the surface of the metal layer.

Example 30 may include elements of example 22 where the means for patterning a mask on the surface of a metal layer may include a photolithographic means for patterning the mask on at least a portion of the surface of the metal layer.

Example 31 may include elements of example 22 where the means for applying an etchant to the exposed portions of the surface of the metal layer may include a means for spraying an etchant under pressure against at least the exposed portions of the surface of the metal layer, at least a portion of the etchant applied along an axis parallel to the axis of incidence of the electromagnetic energy on the exposed portions of the surface of the metal layer.

Example 32 may include elements of example 22 where the means for exposing the exposed portions of the surface of the metal layer to electromagnetic energy in the first spectral band contemporaneous with applying the etchant to form a plurality of voids in the exposed portions of the surface of the metal layer may include a means for exposing the exposed portions of the surface of the metal layer to electromagnetic energy in the first spectral band contemporaneous with applying the etchant to form a plurality of voids, each of the plurality of voids having a diameter of from about 50 micrometers to about 60 micrometers and a pitch of from about 100 micrometers to about 120 micrometers.

According to example 33, there is provided an etchant solution. The etchant solution may include: at least one etchant to selectively remove metal from an exposed surface of a metal layer; and at least one photochemically active material to selectively remove the metal from the exposed surface of the metal layer along an axis of incidence of electromagnetic energy in a first spectral band.

Example 34 may include elements of example 33 where the at least one etchant may include a photochemically active material containing an oxidized transition metal ion or metal ligand complex selected from the group consisting of: $Fe^{3+}$ (ferric), $Zn^{2+}$ (zinc), and $Cu^{2+}$ (cupric) ions.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Accordingly, the claims are intended to cover all such equivalents.

What is claimed:

1. An anisotropic etching system to preferentially remove material along a defined axis, the system comprising:
    an etchant applicator to apply an etchant that includes at least one photochemically active material to a mask disposed on a surface of a metal layer and to an exposed portion of the surface of the metal layer, wherein the disposed mask has one or more of a high absorption with respect to electromagnetic energy in a first spectral band or a high reflectivity with respect to electromagnetic energy in the first spectral band; and
    an illuminator to selectively enhance an anisotropic removal of metal from the surface of the metal layer along an axis of incidence by exposing the exposed portion of the surface of the metal layer to electromagnetic energy in the first spectral band contemporaneous with application of the etchant by the etchant applicator.

2. The system of claim 1 wherein the metal layer comprises a copper layer and the etchant applicator to apply the etchant that includes at least one photochemically active material to the mask and to the exposed portions of the surface of the copper layer.

3. The system of claim 2, the etchant applicator to apply the etchant to the mask and to the exposed portion of a surface of a copper layer disposed at least partially across a surface of a core material.

4. The system of claim 3, the etchant applicator to apply the etchant to a patterned dry film resist and to the exposed portion of the surface of the copper layer disposed at least partially across the surface of the core material.

5. The system of claim 4, the etchant applicator to apply the etchant to a patterned dry film resist and to the exposed portion of a surface of the copper layer disposed at least partially across the surface of the core material.

6. The system of claim 5, the etchant applicator to apply an etchant including a photochemically active material containing an oxidized transition metal ion or metal ligand complex selected from the group consisting of: $Fe^{3+}$ (ferric), $Zn^{2+}$ (zinc), and $Cu^{2+}$ (cupric) ions.

7. The system of claim 6, the illuminator to expose at least the exposed portion of the surface of the metal layer to electromagnetic energy in a first spectral band normally incident on the dry film resist to provide an anisotropic etch in which metal is preferentially removed from the surface of the metal layer along an axis normal to the core material.

8. The system of claim 1, the etchant applicator to apply the etchant that includes the at least one photochemically active material to a photolithographically patterned dry film resist and to the exposed portion of the surface of the metal layer.

9. The system of claim 1, the etchant applicator to apply an etchant via spray against the mask, at least a portion of the etchant applied along an axis parallel to the axis of incidence of the electromagnetic energy in the first spectral band.

10. The system of claim 1, the illuminator to expose at least the exposed portion of the surface of the metal layer to electromagnetic energy in a first spectral band to form the plurality of voids in the surface of the metal layer wherein each of the plurality of voids has a diameter of from about 50 micrometers to about 60 micrometers and a pitch of from about 100 micrometers to about 120 micrometers.

11. An anisotropic etching system to preferentially remove metal along a defined axis, comprising:
a means for patterning a mask on a surface of a metal layer, the mask having one or more of a high absorption with respect to electromagnetic energy in a first spectral band or a high reflectivity with respect to electromagnetic energy in the first spectral band; and
a means for applying an etchant to at least one or more exposed portions of the surface of the metal layer, the etchant including at least one material that is photochemically active with respect to electromagnetic energy in the first spectral band; and
a means for selectively enhancing an anisotropic removal of metal from the surface of the metal layer along an axis of incidence by exposing the one or more exposed portions of the surface of the metal layer to electromagnetic energy in the first spectral band contemporaneous with applying the etchant to form a plurality of voids in the exposed portions of the surface of the metal layer.

12. The system of claim 11 wherein the means for patterning a mask on a surface of a metal layer comprises:
a means for patterning the mask on a surface of a copper layer.

13. The system of claim 12 wherein the means for patterning the mask on a surface of a copper layer comprises:
a means for patterning the mask on the surface of a copper layer disposed at least partially across a surface of a core material.

* * * * *